United States Patent [19]
Liu et al.

[11] Patent Number: 5,789,748
[45] Date of Patent: Aug. 4, 1998

[54] LOW VOLTAGE ELECTRON BEAM SYSTEM

[75] Inventors: Weidong Liu, Palo Alto; R. Fabian W. Pease, Menlo Park, both of Calif.

[73] Assignee: Stanford University, Stanford, Calif.

[21] Appl. No.: 865,377

[22] Filed: May 29, 1997

[51] Int. Cl.⁶ .......................... H01J 37/256; H01J 37/28
[52] U.S. Cl. .................. 250/310; 250/307; 250/397
[58] Field of Search ............................ 250/310, 307, 250/397

[56] References Cited

U.S. PATENT DOCUMENTS

| | | | |
|---|---|---|---|
| 4,896,036 | 1/1990 | Rose et al. | 250/310 |
| 4,987,311 | 1/1991 | Devore | 250/397 |

OTHER PUBLICATIONS

Hordon, L. et al., Improved retarding field optics via image outside field, J. Vac. Sci. Tech. B., 13(3), pp. 826–832, May/Jun. 1995.

*Primary Examiner*—Jack I. Berman
*Attorney, Agent, or Firm*—Lumen Intellectual Property Services

[57] ABSTRACT

An electron beam system provides low aberration, 10 nm resolution at 100 eV landing energy. The system comprises a lens unit [46] having a built-in semiconductor junction detector [58]. The detector surrounds the sample-side of a focusing electrode [48] just upstream from a retarding electrode [50] which is positioned less than a millimeter from the sample [34]. Because the detector is within a few millimeters of the sample, it provides efficient detection of secondary electrons from the sample. The retarding electrode decreases the energies of the primary beam [22] from 10 keV to less than 100 eV, reduces distortions due to sample surface topography, and serves to accelerate secondary electrons back toward the detector, further improving detection efficiency.

11 Claims, 13 Drawing Sheets

LOW VOLTAGE ELECTRON BEAM SYSTEM

This invention was supported in part by NSF through CPIMA under contract number DMR-9400354 and by ARPA through the Office of Naval Research under contract number N00014-94-J-1996. The U.S. Government has certain rights in the invention.

FIELD OF THE INVENTION

This invention relates generally to electron beam systems. More particularly, it relates to low-voltage electron beam systems and low-voltage electron microscopy.

BACKGROUND OF THE INVENTION

A conventional scanning electron microscope (SEM), as pictured in FIG. 1, comprises an electron gun 20 which emits a primary electron beam 22. The beam 22 passes through a condenser lens 24, a spray aperture 26, scanning coils 28, objective lens 30, and objective aperture 32. The focused primary beam 22 then impacts a sample 34 which is positioned upon a microscope stage 36. Secondary electrons 38 emitted from the surface of sample 34 are then collected at a detector 40 which produces a signal dependent upon properties of the sample 34, such as its surface topography. The detector 40 is typically a scintillator-photomultiplier tube arrangement.

When primary beam 22 impacts sample 34, some secondary electrons 38 are emitted from the sample. Other forms of scattering also take place. The relative amounts of these different forms of scattering depends, in part, on the energy of the primary beam. As shown in FIG. 2, the secondary electron yield for very low beam energies increases roughly linearly with energy. As the beam energy increases, however, the secondary electron yield reaches a maximum and then decreases as other forms of scattering begin to dominate.

Because conventional SEMs operate at relatively high voltages, the primary beam electrons have high energies, e.g. 10 keV or more. Unfortunately, these high energy electrons can degrade or damage the sample surface, and cause increased proximity effect. In addition, the conventional high energy SEMs can cause considerable sample charging which can distort the beam path. Due to these problems, the conventional SEM is not suitable for many desirable applications such as the examination of ultrathin insulating films, semiconductor inspection, testing, and applications where the sample is fragile or can not be damaged.

Due to the problems associated with high voltage primary beams, retarding field techniques have been explored as a way to decrease the beam landing energy on the sample. Low landing energies have several advantages: low range in the sample, low level of damage to and heating of the sample, reduced charging of bulk insulating samples, and reduced proximity effect. In one variation of the retarding field technique, electrostatic potentials are applied at objective lens 30 to reduce the energy of electrons in the primary beam prior to their impact on the sample. Although this technique allows beam landing energies in some systems to be reduced to 500 eV, these lower energy systems generally suffer from aberration, low beam brightness, and increased space charge effects. Moreover, because the retarding fields pull the secondary electrons back toward the lens, fewer secondary electrons reach the detector 40. Consequently, these systems suffer from lower secondary electron detection efficiencies. One approach to improving the detection efficiencies in these systems is to place an annular microchannel plate detector just upstream from the objective lens 30. The detection efficiencies of this arrangement are still less than optimal, however, due to the large distance between the bulky detector and the sample.

In another variation on the retarding field approach, the sample itself is held at a retarding potential so that the beam remains focused at high energies until just before it reaches the surface. Although this technique provides a system with lower aberration, large field intensities on the sample surface may cause damage to the sample. Moreover, the surface topography of the sample introduces unwanted distortion to the electric field, causing deformations to the beam and inaccuracies in the scan. One possible technique for avoiding these problems is suggested by Hordon et al. in their article "Improved retarding field optics via image outside field", *J. Vac. Sci. Technol. B* 13(3), May/June, 1995. Their technique is to place an additional retarding electrode with a very small aperture very close to the sample 34 so that the sample is not subjected to the full retarding field. According to their calculations, a system using this technique is not subject to surface topography beam distortion effects. This approach, however, like other retarding field approaches, suffers from very poor detector efficiency, because the bulky detector is positioned far from the sample and detects only a very small fraction of the secondary electrons.

SUMMARY OF THE INVENTION

Accordingly, it is a primary object of the present invention to provide an electron beam system that has electron beam landing energies below 100 eV while maintaining high resolution and high detector efficiency.

Such an electron beam system comprises an electron source which generates a high energy (over 10 keV) primary electron beam directed along an axis toward a material sample. A low aberration micro-objective lens unit is positioned along the beam axis within a few millimeters of the sample. Built into the lens unit is a very compact (less than 500 micron thick) annular semiconductor junction detector. The micro-objective lens unit also comprises a focusing ground electrode having a small aperture, followed by a final retarding electrode positioned less than a millimeter above the sample. The retarding electrode also has a very small aperture through which the primary beam passes. The retarding electrode is held at an electric potential such that it reduces the electric field at the sample surface and lowers the electron beam energy to less than 200 eV (preferably 100 eV or less). The retarding field technique provides the system with a low aberration. The detector is integrated with the focusing electrode on the side facing the sample. Because the detector is positioned within a few millimeters of the sample, it provides superior secondary electron detection efficiency. Moreover, the retarding field configuration allows for acceleration of the secondary electrons onto the junction detector, thus dramatically improving current gain.

The detector is positioned at most 3 mm from the sample and the retarding electrode is positioned at most 200 microns from the sample. In a preferred embodiment, the detector is approximately 2 mm from the sample, the retarding electrode is approximately 0.1 mm from the sample, the aperture of the detector is less than 500 microns in diameter and the aperture of the retarding electrode is less than 200 microns in diameter. The thickness of the integrated electrode/detector is preferably less than 50 microns near the aperture.

The design is optimized to minimize the primary beam diameter and maximize secondary electron collection. For a landing energy of 100 eV, the minimum beam diameter is about 10 nm at 96 μm working distance when the beam energy spread is 0.1 eV. About 50% of secondary electrons can be collected by the compact junction detector. The junction detector and focusing lens are micro-machined as a single integrated unit. The depletion region extends from 0.25 to 5 μm at zero bias.

Because existing electron beam systems may be easily modified to contain the lens-detector components of the present invention, a low energy electron beam system is therefore provided at minimal cost.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
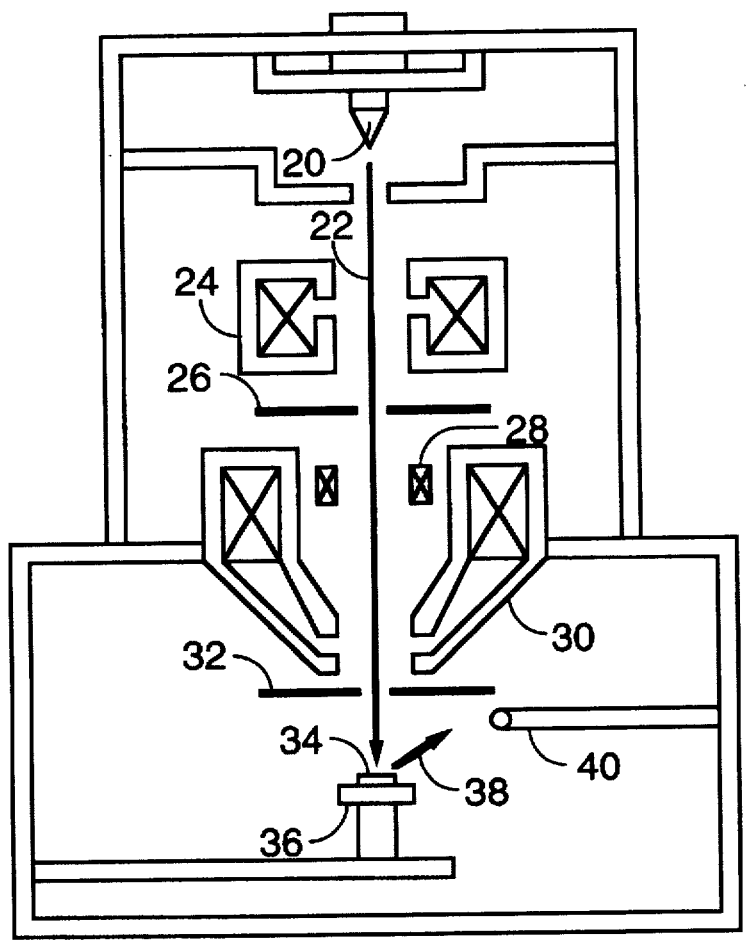
FIG. 1 is a cross-sectional view of a conventional scanning electron microscope system.
Figure 2:
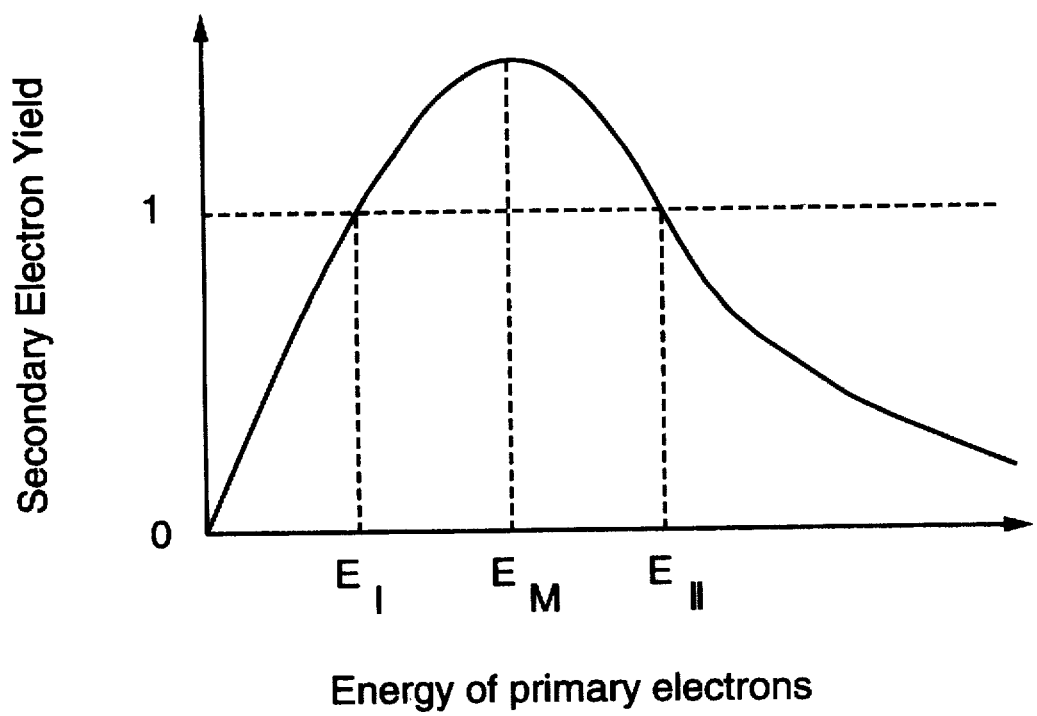
FIG. 2 is a graph illustrating the secondary electron yield for different primary beam energies.
Figure 3:
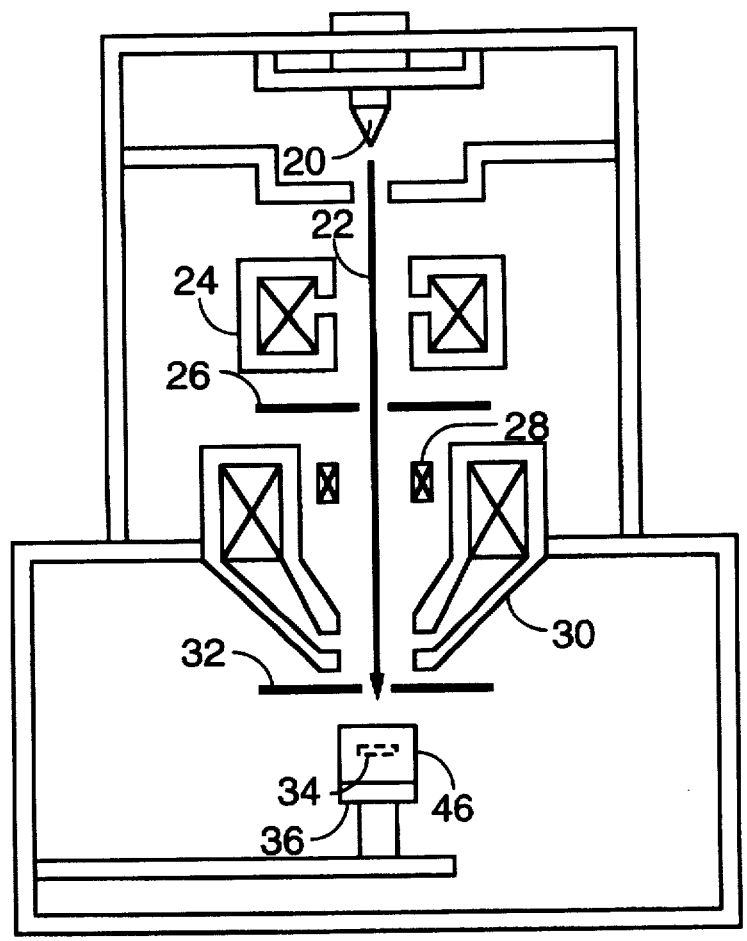
FIG. 3 is a cross-sectional view of a low voltage electron beam system according to the present invention.

An electron beam system according to the present invention is shown in FIG. 3. As in the conventional SEM of FIG. 1, an electron gun 20 emits a high energy (10 keV) primary electron beam 22, preferably with a small energy spread, which then passes along a beam axis through a condenser lens 24, a spray aperture 26, scanning coils 28, objective lens 30, and objective aperture 32. In contrast to the conventional systems, however, the present electron beam system further comprises a micro-lens unit 46 into which the primary beam passes prior to impacting the sample 34, which is contained within the unit 46. After passing into lens unit 46, the primary beam, which now has a reduced energy on the order of 100 eV or less, impacts the sample 34. The SEM performs scanning, astigmatism correction and focus adjustment. The movable objective aperture of the SEM is used to adjust the convergence angle of the beam.

Figure 4:
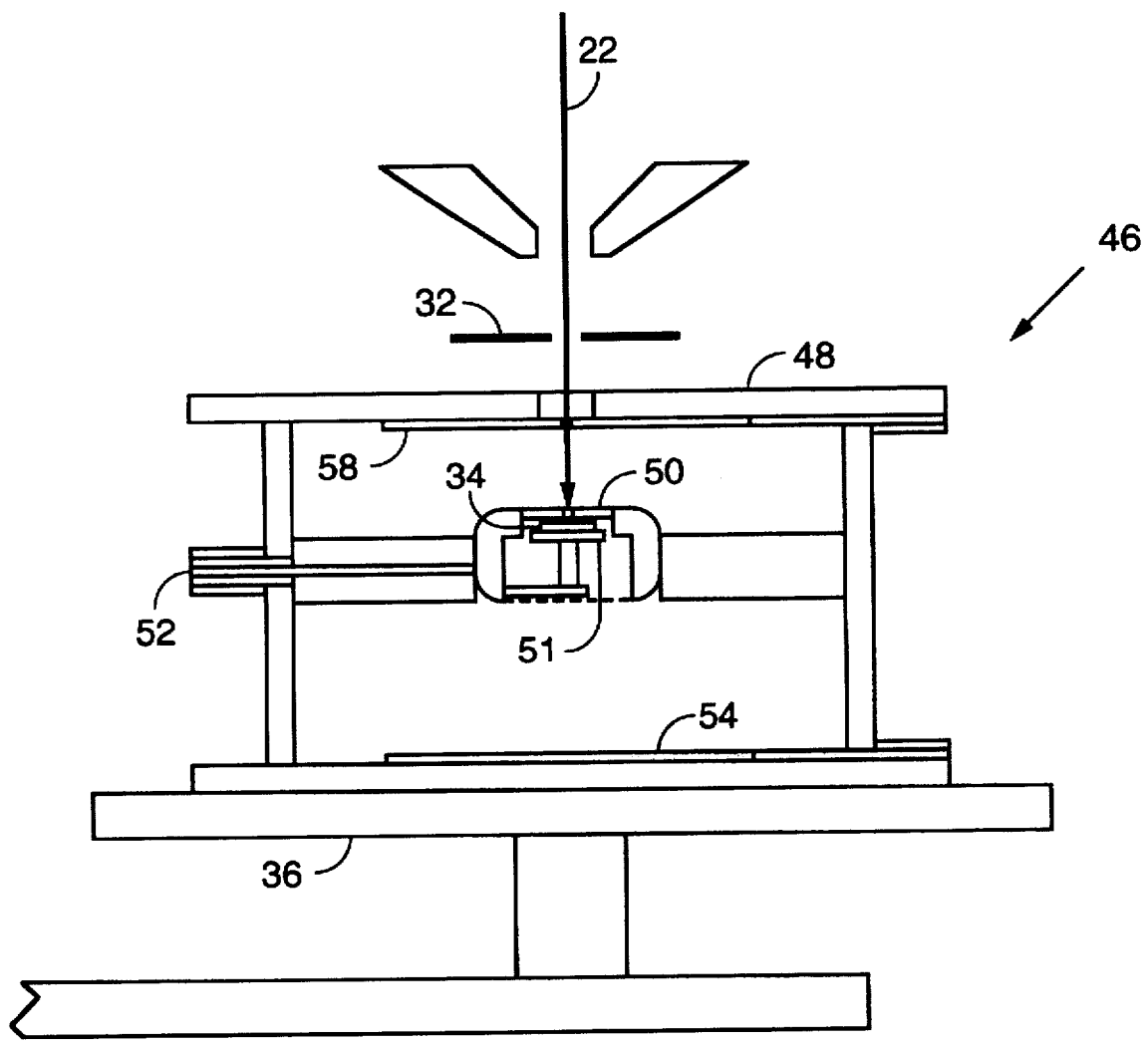
FIG. 4 is a cross-sectional view detailing a micro-lens unit contained in the system of FIG. 3.
Figure 5:
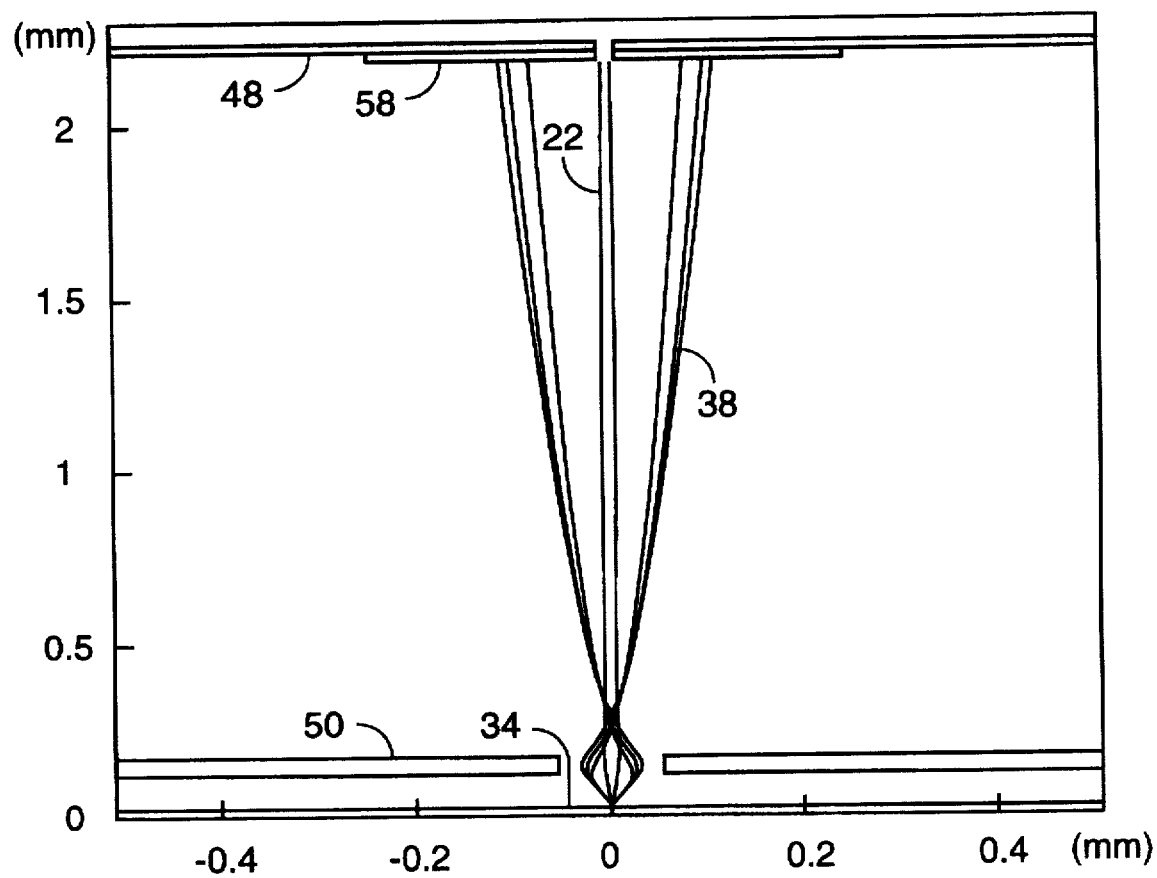
FIG. 5 is a cross-sectional view of a portion of the unit of FIG. 4, showing in detail the trajectories of primary and secondary electrons. The diameter of the detector aperture is 20 μm and the emission angle of secondary electrons is 20 degrees.

FIGS. 4 and 5 detail the micro-lens unit 46 which comprises a focusing electrode 48, and a retarding electrode 50 made of molybdenum. The 10 keV primary beam 22 passes through a central aperture of the focusing electrode 48, held at ground potential, then through an aperture of retarding electrode 50, which is held at a potential of −9.9 kV, thereby reducing the energy of the primary beam to 100 eV. Retarding electrode 50 is may be attached by a 100 μm thick spacer to the surface of sample 34. The spacer is made of a conductive material and is designed to maintain an equipotential between the retarding electrode and the sample, thereby minimizing the electric field distortions at the sample surface. Preferably, the sample is attached to a movable micro-stage 51 which holds the sample at an equipotential with the retarding electrode and permits controlled lateral movement of the sample beneath the retarding aperture. The retarding electrode-sample combination is connected by a high voltage feedthrough 52 to a power supply providing the retarding potential. The power supply is calibrated by operating the lens in a transmission mode while using a copper grid as the sample, attached to the retarding electrode by a spacer. Electrons transmitted through the grid are detected using a bottom silicon detector 54 positioned beneath the grid. (The micro-stage 51 is naturally taken out for this procedure.) The lens assembly is electrically isolated from the SEM stage and shielded to the outside ground to prevent high voltage hazard and to reduce the noise due to stray electromagnetic field in SEM chamber.

After passing through the retarding electrode, the low energy beam 22 impacts the sample 34, producing secondary electrons 38, some of which travel through retarding electrode 50 toward ground electrode 48. An annular semiconductor junction detector 58 for detecting secondary electrons 38 is fabricated on the sample side of electrode 48. The retarding field both lowers aberration of the objective lens and accelerates the secondary electrons to improve the detection. FIG. 5 details the path of the primary beam 22 through the focusing electrode 48 and through retarding electrode 50. The figure also shows the paths of secondary electrons 38 from the sample 34 through the retarding electrode 50 and to the detector 58. The three secondary electron trajectories shown are for secondary electron energies of 2 eV, 5 eV, and 10 eV. As indicated in the figure, the overall length of the lens is less than 4 mm. The bore diameter of the aperture in the retarding lens is 100 μm.

A special setup was used to align the retarding aperture and the detector aperture, where each of the electrodes is fixed to a set of high precision micrometers. First the two electrodes are brought together and made parallel to each other. Then a laser beam is irradiated normally to the electrodes. A sensitive power meter is used to detect the light going through both apertures. The intensity is at maximum when the apertures are centered on the same axis. The accuracy of this alignment method, which is less than 1 μm, is limited by the noise of the laser and detector. Using simulation techniques, the effects of 1 μm misalignment of the two apertures can be estimated. For 100 eV landing energy, the beam broadening is 0.6 nm, which is much smaller than the minimum beam diameter.

The lens may be tested in a custom electron optical test bench to check for aperture misalignment and electric breakdown. Because of the high voltage between the ground and retarding electrodes, any arcing not only destroys the silicon detector, but also may damage the instrument connected to the output of the detector. To reduce this risk, a 10 MΩ resistor is inserted in the high voltage feedthrough to limit the current during an electric breakdown. A preamplifier may be used at the output of the detector to protect subsequent instruments. In addition, the preamplifier provides a current gain of about 1000. The signal is further amplified by a transconductance amplifier. Then it is fed into either the SEM video input for imaging or an oscilloscope for signal analysis. The gain of the preamplifier can be varied to adjust the contrast of the image; while the brightness of the image is adjusted by current suppression controls.

Using known computer modeling techniques, the system is designed to achieve small primary beam diameter, large secondary electron collection efficiency, and small electric field at the sample. The spherical and chromatic aberrations coefficients ($C_s$ and $C_c$) may be calculated using known algorithms which are suitable for retarding systems. For a 100 μm working distance between the sample and the retarding electrode, the spherical and chromatic aberration coefficients are 0.229 mm and 0.098 mm, respectively. They change very little when the bore diameter of the detector aperture varies from 2 to 200 μm and are dominated by the contributions of the retarding field. Consequently, the aperture size on the detector may be designed to optimize the convergence angle of the beam at sample surface for minimum beam diameter.

The spacing (L) between the ground electrode and retarding electrode is set to 2 mm because while $C_s$ and $C_c$ decrease with smaller L, the design is subjected to the maximum practical electric field in vacuum (about $10^5$ V/cm). The bore diameter of the retarding aperture ($d_R$) is chosen to be 100 μm. A smaller $d_R$ gives a smaller surface field, and smaller $C_s$ and $C_c$; however the SE collection rate and the field of view decrease. $C_s$ and $C_c$ increase rapidly when the thickness of the retarding electrode ($t_R$) goes below 30 μm. Above this value, $C_s$ and $C_c$ change slowly, but increasing $t_R$ reduces the working distance and SE collection. So $t_R$ is set to 50 μm. The diameter of the aperture in the detector ($d_G$) is 20 μm. If $d_G$ is too small, the incident primary beam is blocked; if it is too large, more SEs will escape from the aperture in the detector. The working distance (WD) is set to 100 μm. A smaller WD gives smaller $C_c$ and $C_s$, larger SE collection, and larger field of view; however, the field on surface increases and sample handling is more difficult due to reduced clearance.

Figure 6A:
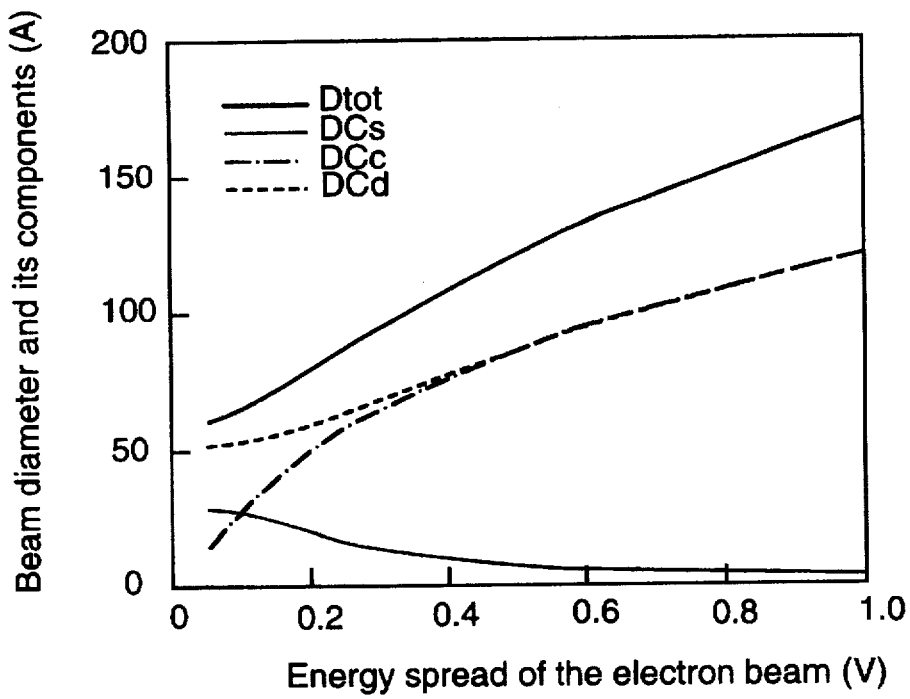
FIG. 6A is a graph of beam diameter and its components at optimum convergence angle vs. energy spread. The electrons are retarded from 10 keV to 100 eV. The retarding aperture diameter is 100 μm and the working distance is 96 μm.
Figure 6B:
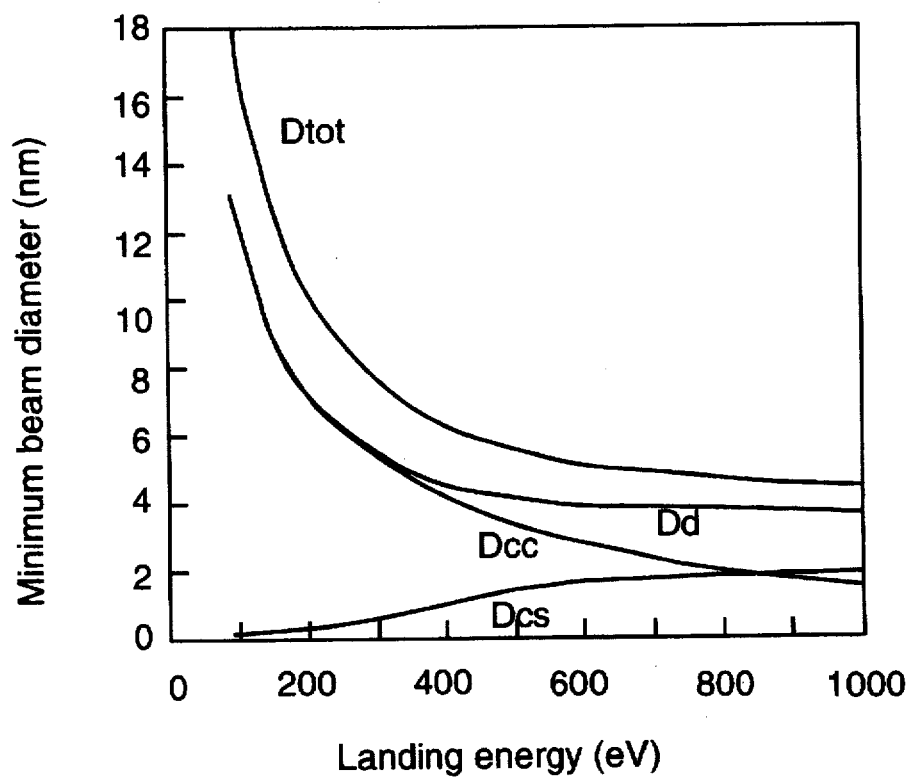
FIG. 6B is a graph of minimum beam diameter and its components vs. landing energy of the primary beam.
Figure 7:
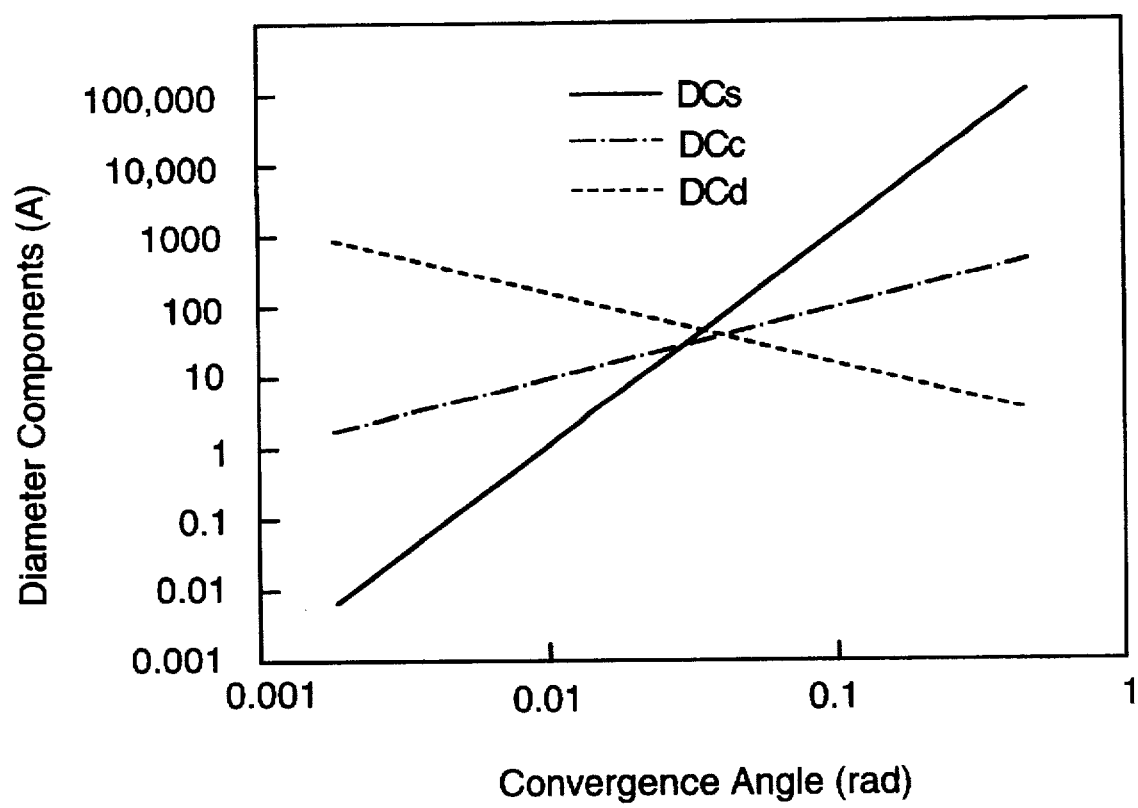
FIG. 7 is a graph of components of beam diameter from spherical aberration, chromatic aberration, and diffraction. The landing energy is 100 eV and energy spread is 0.1 eV.

The beam diameter ($D_{tot}$) at zero current density is conservatively estimated by $$D_{tot}^2 = \left(\frac{1}{2} C_s \alpha^3\right)^2 + \left(C_c \frac{\Delta V}{V} \alpha\right)^2 + \left(1.22 \frac{\lambda}{\alpha}\right)^2, \quad (1)$$

where α is the semiconvergence angle at the sample surface and ΔV is the energy spread of the beam, assumed to be 1 eV. The three terms of the equation account for spherical aberration, chromatic aberration, and diffraction, respectively. Because of the low landing energy (i.e. on the order of 100 eV), diffraction and chromatic components dominate when ΔV is above 0.1 V, and the beam diameter decreases with decreasing energy spread, as shown in FIG. 5. Thus high resolution requires a low energy spread electron source 20 (FIG. 3) such as a negative electron affinity cathode. When ΔV is less than 0.1 eV (and V=100 V), the contribution from chromatic aberration is less than that from spherical aberration or diffraction irrespective of convergence angle, as shown in FIG. 6A. The beam diameter is 6.5 nm when α is 28.5 mrad. The size of electron source is not accounted for in Eq. (1). If we assume it can be demagnified to the same value (6.5 nm), the total beam diameter should be less than 10 nm for 5 pA probe current at a beam brightness of $10^4$ A/cm²/sr.

For 100 eV landing energy, the spherical and chromatic aberration coefficients are 0.229 mm and 0.098 mm respectively. The minimum beam diameter is 17.2 nm at the optimum convergence angle 12.3 mrad. The depth of focus, commonly defined as the resolution divided by beam semiangle, is 1.4 μm. Diffraction and chromatic aberration components dominate when landing energy is smaller than 500 eV, and the beam diameter increases rapidly at lower landing energies. Smaller beam diameter can be achieved with a low energy spread electron source such as a negative electron affinity cathode. When the landing energy is above 500 eV, the contribution from spherical aberration increases with landing energy and eventually becomes more than that from chromatic aberration at about 800 eV.

With the additional retarding aperture the electric field on the sample surface falls off rapidly with the increase of working distance. For the design of 100 eV landing energy and 100 μm working distance, the on-axis field on the sample surface is about $1.5 \times 10^4$ V/m, which is more than two orders of magnitude smaller than the field in the retarding region ($5 \times 10^6$ V/m). The surface field at off-axis positions is even smaller. Thus the sample is much less likely to be damaged by the electric field. Also, because of the small surface field, the electron optical performance of the retarding lens is less affected by the surface topography of the sample. In the traditional design, the field distortion due to 1 μm surface features causes the off-axis beam to broaden about 1.4 nm and the landing position shift about 43 nm. When the retarding aperture is used, the beam broadening is 0.7 nm and the shift of landing position is very small (0.04 nm). Thus image distortion due to surface topography is much less in the present design, even though the effects to the resolution are small in both cases.

Figure 8:
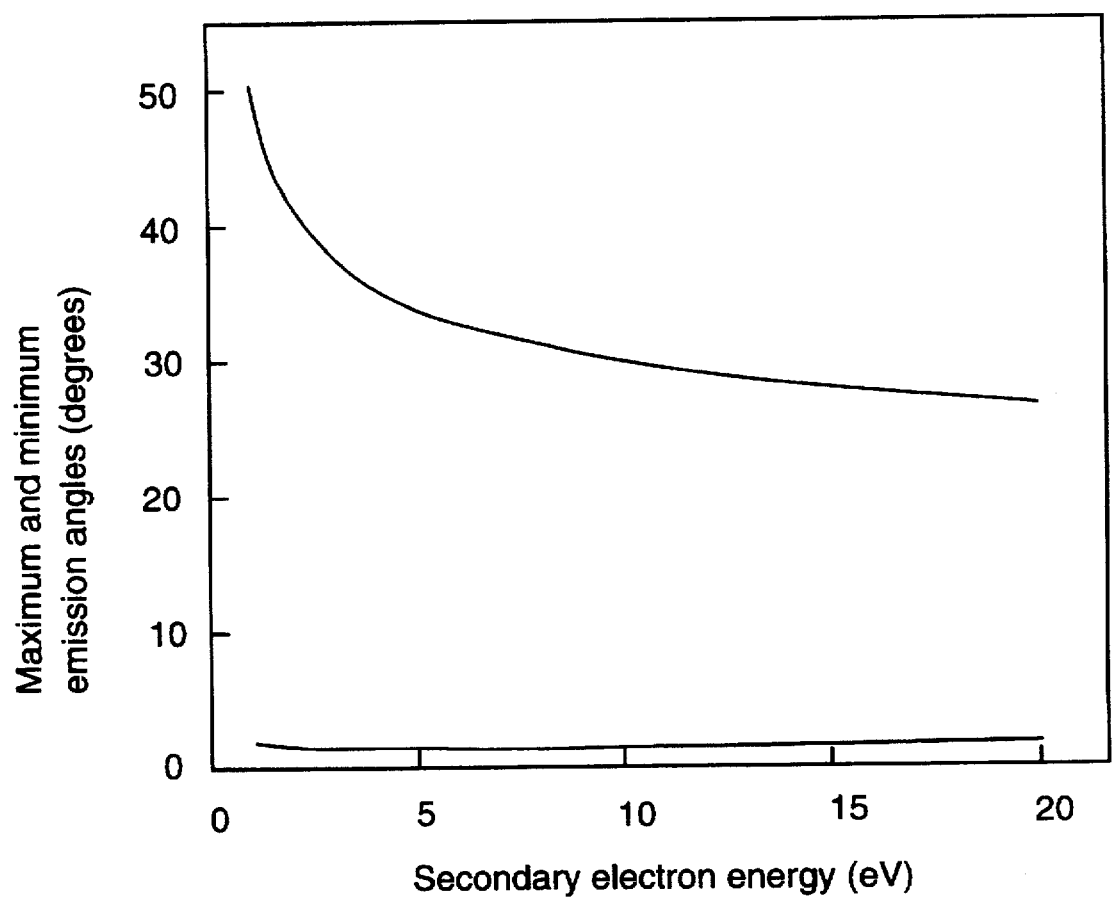
FIG. 8 is a graph showing the range of emission angles of secondary electrons which will assure their reaching the active area on the detector surface.

The trajectories of primary and secondary electrons are shown in FIG. 5. For the above design that yields optimum resolution, the resulting primary beam limiting aperture on the detector is about 20 μm in diameter. A secondary electron emitted from the sample surface will be collected by the detector if its emission angle is within a certain range, depending on its initial kinetic energy. Above the maximum angle, the electrons are intercepted by the retarding electrode, while below the minimum angle, the electrons pass through the aperture in the detector and are not collected, as shown in FIG. 8. For example, secondary electrons of initial energies less than 15 eV and emission angles between 1 degree and 30 degrees will be collected. For a cosine distribution of emission angles we estimate that for most materials at least 50% of the secondary electrons will land on the active detector surface.

The integrated lens/detector was fabricated using silicon micro-machining techniques. Because the low energy secondary electrons are accelerated onto the detector, we can avoid the use of a surface junction metal-semiconductor-metal detector with its associated high leakage current and use instead a high quality semiconductor p-n junction. The detector used in the present system is particularly compact and is specially fabricated as an integral part of the primary electron beam lens. The processing has been optimized to minimize deadlayer. The detector has an area of 0.8 mm² with a center bore 20 μm in diameter. The top surface contact is a thin layer of aluminum. This layer also acts as a mask for silicon dry etch. The drawback of using a p⁺n diode is the deadlayer induced by the neutral p⁺ region. To make the deadlayer suitably thin (0.25 μm), we used low energy $BF_2$ implantation and rapid thermal annealing (RTA). The detector's active area is determined by the spread of the secondary electrons incident on the surface, which is within a 250 μm radius. While we could use a larger area to collect electrons landing further from the axis, the extra active device area would result in extra capacitance, which adversely affects the bandwidth and signal-to-noise ratio of the detector. The active area of the detector is fabricated to be electrically isolated by a narrow insulating region from the focusing electrode. This isolation helps to minimize detector capacitance and increase robustness against accidental arcing.

Figure 9:
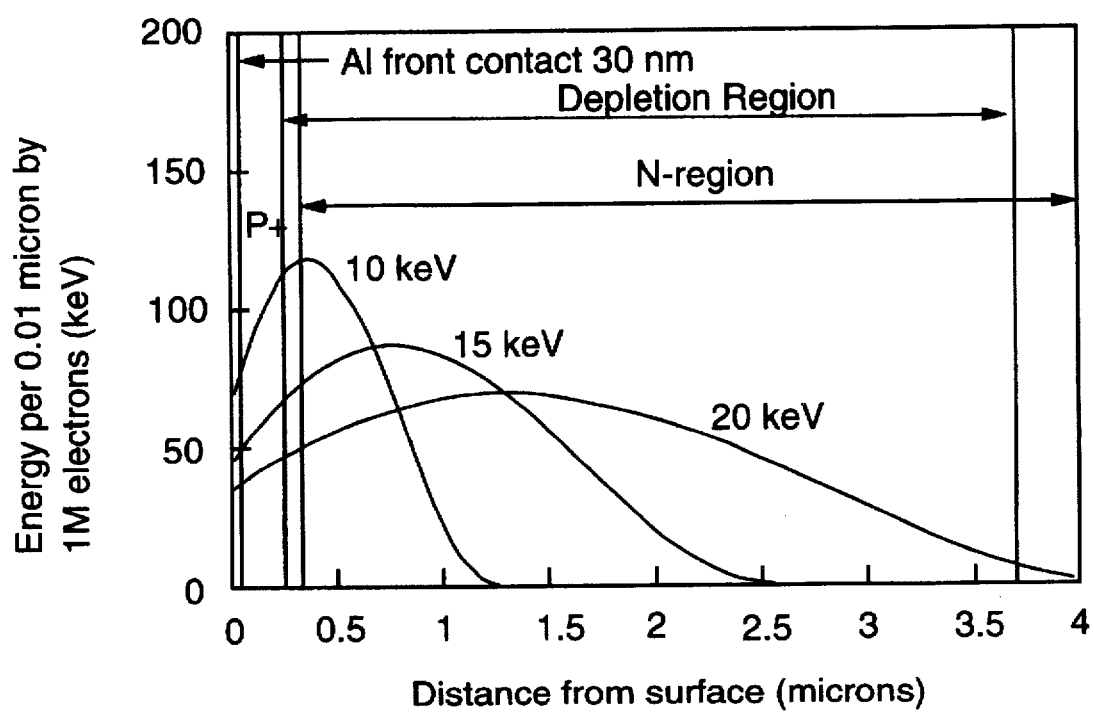
FIG. 9 is a graph of computed energy density distribution in a silicon detector of the invention. The energies of incident electrons are 10, 15, and 20 keV.

We use a highly doped n-type silicon substrate for small series resistance with a lightly n-type epitaxial layer. The layer's thickness and doping concentration are determined by the desired depletion width of the p-n junction. From the computed distribution of electron energy deposited in the detector, as shown in FIG. 9, we can see that the depletion region needs to be 1.5 μm deep for 10 keV electrons, and 4.5 μm for 20 keV electrons. Therefore we chose the epitaxy layer to be 5 μm thick with $10^{14}$ cm⁻³ doping concentration. The p⁺ region is made by $BF_2$ implantation at 32 keV and dose of $10^{14}$ cm⁻³, followed by RTA at 1000 C. for 10 s. The dopant profile is obtained using SUPREM3 simulation. The resulting depletion region is also shown in FIG. 9, and at zero bias extends from a depth of 0.25 to 3.54 μm. The maximum transit time t for the carriers to traverse the depletion region is estimated to be 1.85 ns under zero bias conditions and even less when biased. The junction capacitance is calculated to be 110 pF. Depending on the value of series resistance, either RC delay or the transit time will limit the bandwidth of the detector.

Figure 10A:
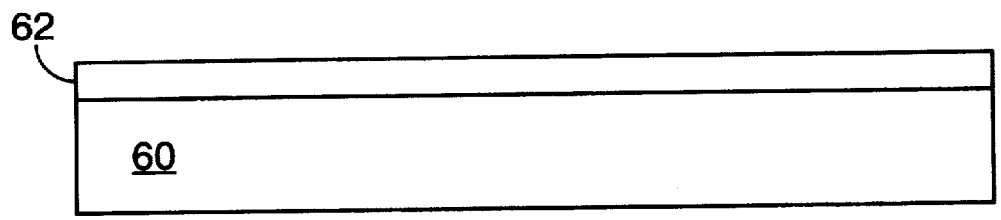
FIGS. 10A–10E illustrate the processing sequence for a detector in accordance with the present invention.

The major processing steps in fabricating the detector 58 are illustrated in FIGS. 10A–10E. The process begins with a 300 μm thick double-sided polished silicon n⁺ substrate 60 having a <100> orientation and a phosphorus doping concentration of about $2 \times 10^{18}$ cm⁻³. As shown in FIG. 10A, a 3 to 5 μm thick epitaxial n⁻ layer 62 with a doping concentration of $10^{14}$ cm⁻³ is then grown upon the substrate.

Figure 10B:
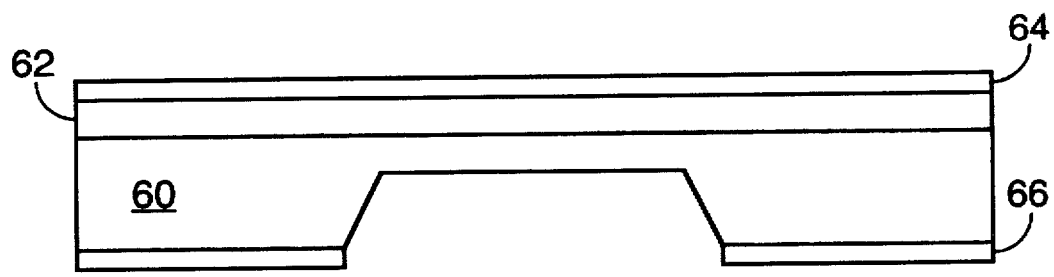

The next step includes field oxidation on both sides to create a 0.5 μm thick $SiO_2$ layer 64 on top of the n⁻ layer 62, and another 0.5 μm thick $SiO_2$ layer 66 under the n⁺ layer 60, as shown in FIG. 10B. The wet oxidation is performed at 1100 C. for 45 min. and the oxide thickness measured using nanospec.

Next the front side is coated with thick resist. This step includes a singe in an oven at 150 C. for 30 min., followed by a spin cast resist at 2000 rpm for 20 sec., and a post bake at 150 C. for 20 min.

Figure 12A:
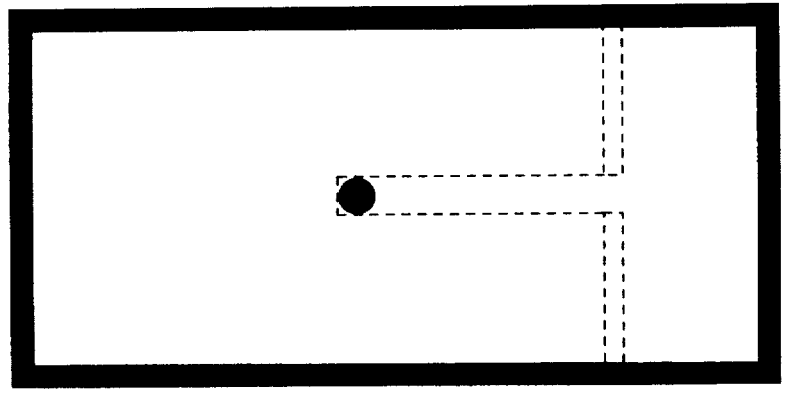
FIGS. 12A and 12B show the first and second mask patterns, respectively, used in the processing steps shown in FIGS. 10A–10E.

The backside oxide layer 66 is then patterned and etched in a central region to 15 μm, as shown in FIG. 10B. The patterning step includes a resist coat and spin case at 2000 rpm for 20 sec., a prebake at 90 C. for 25 min., a resist exposure using a first mask (FIG. 12A), a development in MF-319 for 80 sec., and a postbake at 110 C. for 25 min. The etch step includes soaking in DI water for 15 sec., an oxide etch for 15 min., and stripping the resist using EMT-130T solution. Then the substrate is etched from the back side using TMAH 25 wt % at 90 C. to make a 10 to 20 μm thick membrane in the central region.

Figure 10C:
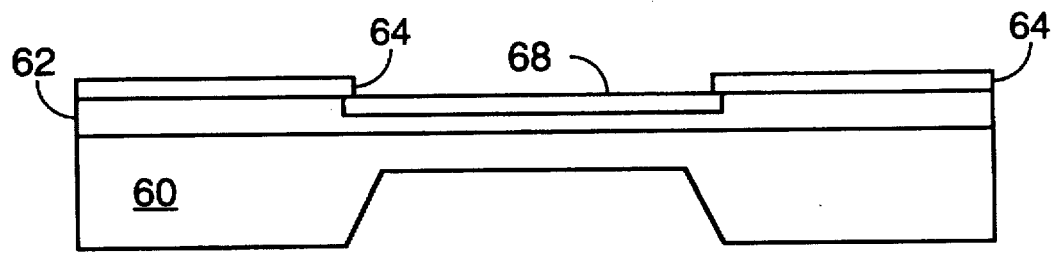

The next step, the result of which is shown in FIG. 10C, includes a pattern of the top oxide layer 64 and a $BF_2$ implantation to create a p⁺ layer 68. The top patterning is performed by active area lithography using a first mask (FIG. 12A) as before. Then a wet etch is used to remove the oxide from the patterned area on the top and back, and the resist is stripped. The implantation is performed with a 32 kV beam energy to deliver a dose of $10^{14}$ cm⁻². Also included in this step is a RTA for 10 s at 1000 C.

Figure 10D:
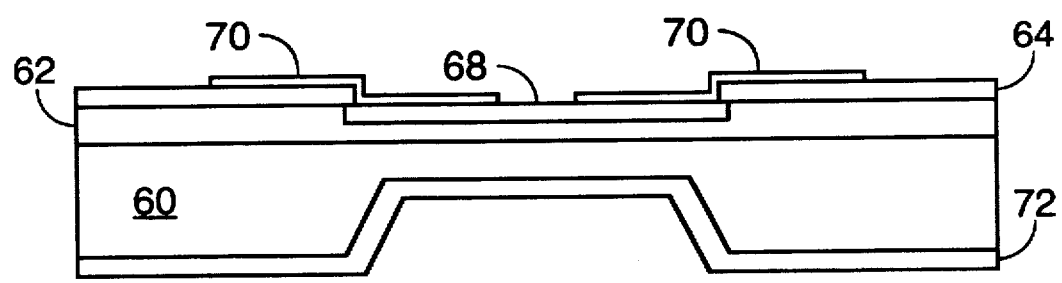
Figure 12B:
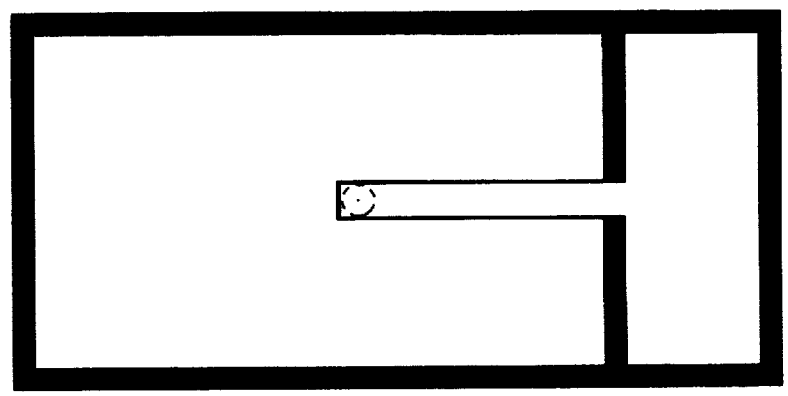

FIG. 10D shows the result of the next step which includes deposition of a 30 nm thick aluminum layer 70 on top of layers 64 and 68 using e-beam-evaporation. Lithography of the aluminum layer 70 is also performed in this step using a second mask (FIG. 12B), and a corresponding wet etch using HF 50:1 for 30 sec. to open a bore and create the top contact. After the resist is stripped, a 300 nm thick TiW layer 72 is sputtered onto the bottom of substrate 60 to create the backside contact.

Figure 10E:
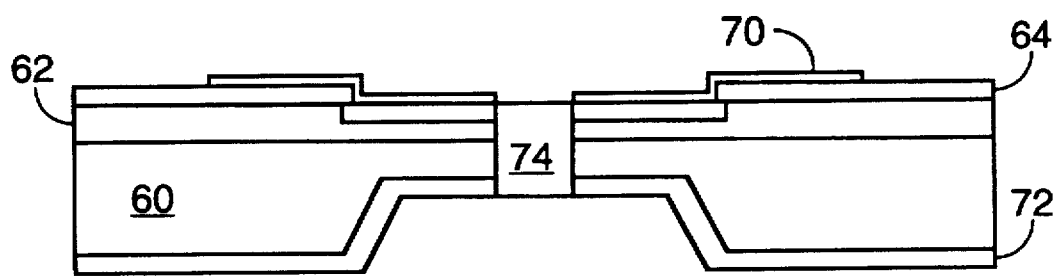

As shown in FIG. 10E, the last step is a dry etch, using RIE with the aluminum layer 70 as a mask, through layers 72, 60, 62, and 68 to create an aperture 74. The device may then be cut with a wafersaw and tested.

The 15-μm-thick silicon membrane of area about 1 mm² is strong enough to survive vacuum chucking ($10^4$–$10^5$ Pa). When the detector is immersed in the retarding field of the micro-column, the pressure acting on its surface by the static electric field ($5 \times 10^6$ V/m) is about 110 Pa. Thus the silicon membrane can easily survive the applied electric field. The silicon micro-machined apertures fabricated in this way have much better quality in terms of surface flatness and edge roughness than do electron beam apertures that are now commercially available.

Figure 11:
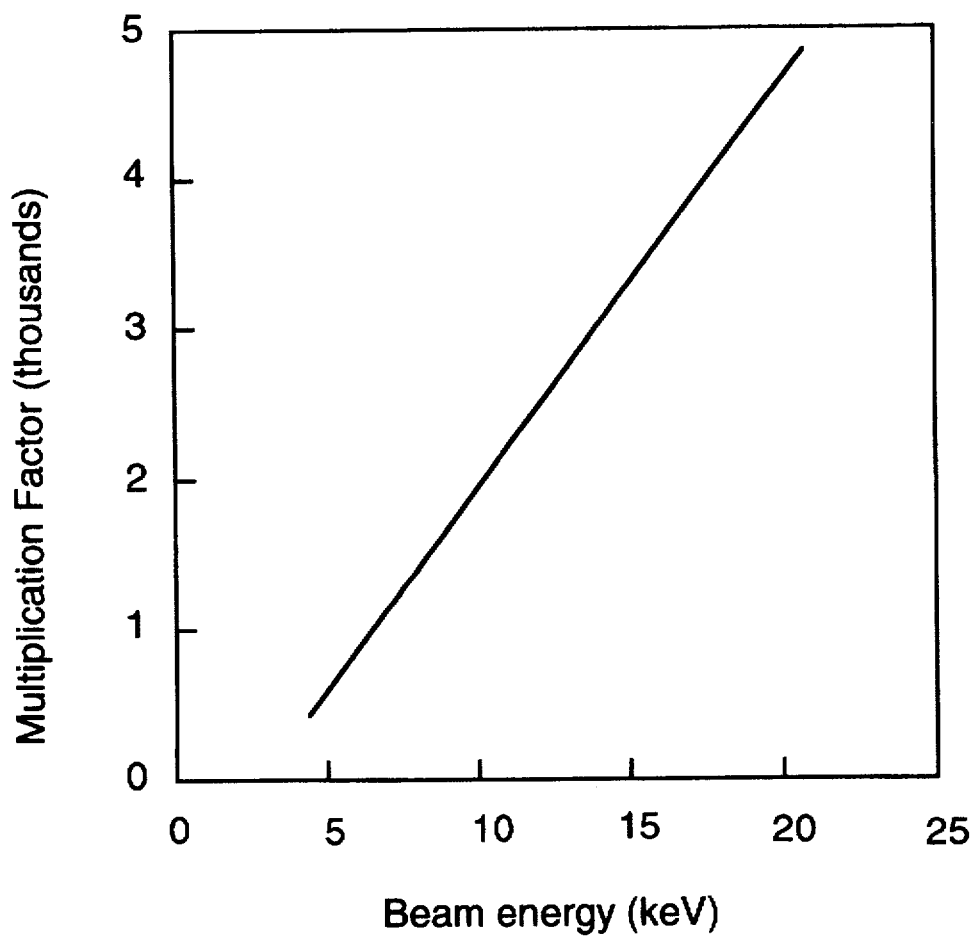
FIG. 11 is a graph of detector current gain vs. incident electron energy.

The performance of the detector may be tested by measuring the current induced by electron bombardment at different energies, both biased and unbiased. As shown in FIG. 11, the current gain is 2010 at 10 keV and 1.8 nA incident current, irrespective of bias. At 20 keV, the gain is 4680, which is almost double that obtained with other known techniques. Thus a primary current of 10 pA will yield a diode current of 10 nA, assuming approximately unity secondary electron coefficient at 100 eV. This is sufficient to allow low noise amplification using well known external circuitry.

There are many applications of the present invention in research and industry. Low energy electron beams have applications in semiconductor manufacturing for wafer and mask inspection because of their low level of damage to the sample, and the reduced charging effects when the electron energy is close to $E_{II}$ where secondary electron yield is unity. Also, due to the short interaction range of the electrons with the sample and the reduced proximity effect, electron beams with even lower energies are attractive for a variety of other applications such as thin film microscopy, surface studies and lithography.

Some variations in the design described above may be attractive; these include the use of 20 keV accelerating potential, the use of a split-field detector, and the incorporation of in situ amplifying circuitry.

It will be clear to one skilled in the art that the above embodiment may be altered in many ways without departing from the scope of the invention. For example, using known techniques together with the principles of the present teaching, the particular dimensions, voltages, and materials may be varied to suit the needs of various applications. Accordingly, the scope of the invention should be determined by the following claims and their legal equivalents.

What is claimed is:

1. An electron beam system comprising an electron source adapted to produce a primary electron beam directed along an axis toward a material sample; and a lens unit positioned along the beam axis, wherein the lens unit comprises:

an annular semiconductor junction detector positioned on the axis less than 3 mm from the sample; and a retarding electrode positioned on the axis between the detector and the sample at a distance less than 200 microns from the sample, and wherein the retarding electrode is held at an electric potential adapted to reduce electron energies of the primary electron beam to less than 200 eV.

2. The system of claim 1 wherein the retarding electrode has a retarding aperture less than 500 microns in diameter.

3. The system of claim 1 wherein the detector has a thickness less than 500 microns and a focusing aperture with a diameter less than 200 microns.

4. The system of claim 3 wherein the lens unit further comprises a micromachined focusing electrode integrated with the detector.

5. The system of claim 4 wherein the integrated electrode and detector have a combined thickness of less than 50 microns at an edge of the focusing aperture.

6. The system of claim 4 wherein the detector is electrically isolated from the focusing electrode.

7. A method for low-voltage electron microscopy comprising:

producing a primary electron beam directed along an axis toward a material sample;

passing the beam through an aperture of an annular semiconductor junction detector positioned less than 3 mm from the sample;

passing the beam through an aperture of a retarding electrode positioned between the detector and the sample at a distance less than 200 microns from the sample, thereby decreasing electron energies of the primary electron beam to less than 200 eV; and detecting with the detector secondary electrons emitted from the sample and passed through the aperture of the retarding electrode.

8. The method of claim 7 wherein the aperture of the retarding electrode is less than 500 microns in diameter.

9. The method of claim 7 wherein the detector has a thickness less than 500 microns and the aperture of the detector has a diameter less than 200 microns.

10. The method of claim 9 wherein the detector is a micromachined device integrated with a focusing electrode.

11. The method of claim 10 wherein the integrated electrode and detector have a combined thickness of less than 50 microns at an edge of the aperture of.

* * * * *